United States Patent
Shah et al.

(10) Patent No.: US 8,197,636 B2
(45) Date of Patent: *Jun. 12, 2012

(54) SYSTEMS FOR PLASMA ENHANCED CHEMICAL VAPOR DEPOSITION AND BEVEL EDGE ETCHING

(75) Inventors: Ashish Shah, Santa Clara, CA (US); Dale R. DuBois, Los Gatos, CA (US); Ganesh Balasubramanian, Sunnyvale, CA (US); Mark A. Fodor, Redwood City, CA (US); Eui Kyoon Kim, Campbell, CA (US); Chiu Chan, Foster City, CA (US); Karthik Janakiraman, San Jose, CA (US); Thomas Nowak, Cupertino, CA (US); Joseph C. Werner, Santa Clara, CA (US); Visweswaren Sivaramakrishnan, Cupertino, CA (US); Mohamad Ayoub, San Jose, CA (US); Amir Al-Bayati, San Jose, CA (US); Jianhua Zhou, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1087 days.

This patent is subject to a terminal disclaimer.

(21) Appl. No.: 12/106,881

(22) Filed: Apr. 21, 2008

(65) Prior Publication Data
US 2009/0014127 A1    Jan. 15, 2009

Related U.S. Application Data

(60) Provisional application No. 60/949,397, filed on Jul. 12, 2007, provisional application No. 60/982,961, filed on Oct. 26, 2007, provisional application No. 60/982,993, filed on Oct. 26, 2007.

(51) Int. Cl.
*C23F 1/00* (2006.01)
*C23C 16/00* (2006.01)
*H01L 21/306* (2006.01)

(52) U.S. Cl. ......... 156/345.32; 156/345.31; 156/345.33; 156/345.34; 156/345.43; 118/719; 118/723 E

(58) Field of Classification Search .................. 118/719; 156/345.31, 345.32, 345.33, 345.34; 414/939
See application file for complete search history.

(56) References Cited

U.S. PATENT DOCUMENTS
5,134,965 A * 8/1992 Tokuda et al. ........ 118/723 MW
(Continued)

FOREIGN PATENT DOCUMENTS
CN    1132800 A    10/1996
(Continued)

OTHER PUBLICATIONS

First Office Action dated Dec. 3, 2010 for Chinese Patent Application No. 200880024320.3.
(Continued)

*Primary Examiner* — Karla Moore
(74) *Attorney, Agent, or Firm* — Patterson & Sheridan, LLP

(57) ABSTRACT

Embodiments described herein relate to a substrate processing system that integrates substrate edge processing capabilities. Illustrated examples of the processing system include, without limitations, a factory interface, a loadlock chamber, a transfer chamber, and one or more twin process chambers having two or more processing regions that are isolatable from each other and share a common gas supply and a common exhaust pump. The processing regions in each twin process chamber include separate gas distribution assemblies and RF power sources to provide plasma at selective regions on a substrate surface in each processing region. Each twin process chamber is thereby configured to allow multiple, isolated processes to be performed concurrently on at least two substrates in the processing regions.

11 Claims, 11 Drawing Sheets

U.S. PATENT DOCUMENTS

| | | | |
|---|---|---|---|
| 5,532,190 A * | 7/1996 | Goodyear et al. | 438/710 |
| 5,849,455 A | 12/1998 | Ueda et al. | |
| 5,871,811 A | 2/1999 | Wang et al. | |
| 5,954,072 A | 9/1999 | Matusita | |
| 6,004,631 A * | 12/1999 | Mori | 427/534 |
| 6,042,687 A | 3/2000 | Singh et al. | |
| 6,167,893 B1 | 1/2001 | Taatjes et al. | |
| 6,273,484 B1 | 8/2001 | Peng | |
| 6,294,026 B1 * | 9/2001 | Roithner et al. | 118/715 |
| 6,391,787 B1 * | 5/2002 | Dhindsa et al. | 438/710 |
| 6,478,924 B1 | 11/2002 | Shamouilian et al. | |
| 6,591,850 B2 * | 7/2003 | Rocha-Alvarez et al. | 137/9 |
| 2008/0173401 A1 | 7/2008 | Jeon | |
| 2009/0017635 A1 * | 1/2009 | Shah et al. | 438/729 |

FOREIGN PATENT DOCUMENTS

| | | |
|---|---|---|
| CN | 1909193 A | 2/2007 |
| EP | 1750294 A1 * | 2/2007 |
| KR | 2005049903 A * | 5/2005 |

OTHER PUBLICATIONS

PCT International Search Report and Written Opinion dated Sep. 17, 2008 for International Application No. PCT/US2008/69547.

PCT International Search Report and Written Opinion dated Oct. 9, 2008 for International Application No. PCT/US2008/069545.

First Office Action dated Jan. 12, 2011 for Chinese Patent Application No. 2011010800041680.

* cited by examiner

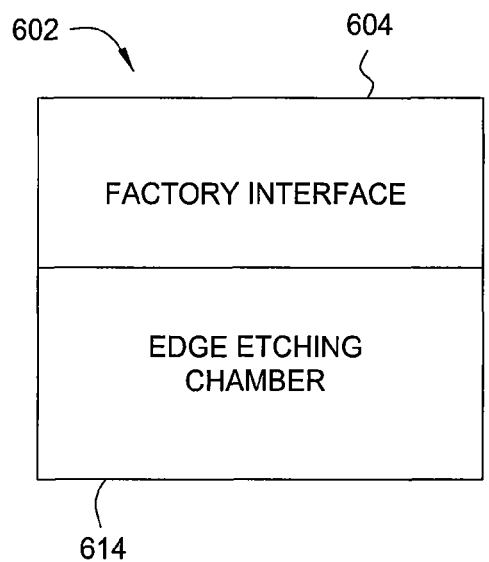
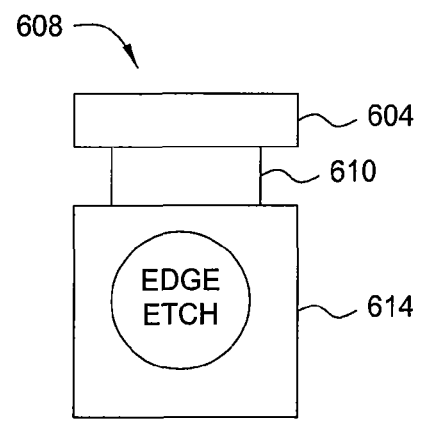
FIG. 7A          FIG. 7B
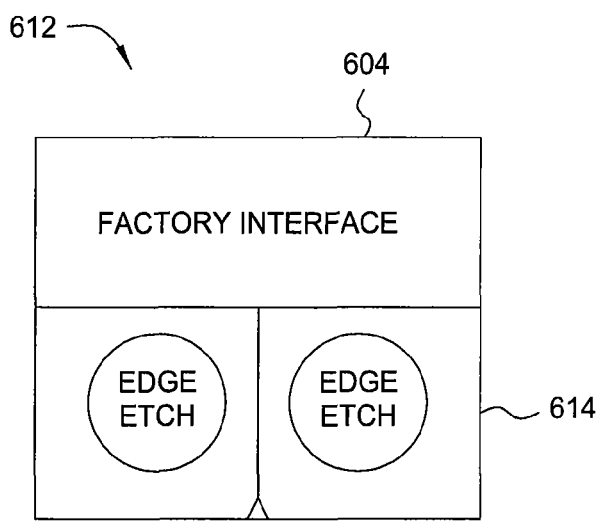
FIG. 8

SYSTEMS FOR PLASMA ENHANCED CHEMICAL VAPOR DEPOSITION AND BEVEL EDGE ETCHING

CROSS-REFERENCE TO RELATED APPLICATIONS

This application claims the benefit of U.S. Provisional Patent Applications Ser. No. 60/949,397, filed Jul. 12, 2007, Ser. No. 60/982,961, filed Oct. 26, 2007, and Ser. No. 60/982,993, filed Oct. 26, 2007. All aforementioned patent applications are herein incorporated by reference.

BACKGROUND OF THE INVENTION

1. Field of the Invention

Embodiments of the invention generally relate to apparatus and methods for processing semiconductor substrates. More particularly, embodiments of the present invention relate to apparatus and methods for processing a substrate near an edge region.

2. Description of the Related Art

To reduce the cost of ownership, semiconductor manufacture processes may be performed in an integrated system that is capable of processing multiple substrates in parallel with high repeatability. The integrated system usually comprises a factory interface, a loadlock chamber and a substrate deposition chamber adapted to form a deposition film on one or more substrates by chemical vapor deposition (CVD) or plasma enhanced chemical vapor deposition (PECVD) processes.

During the CVD/PECVD process, it is usually desirable to have a uniform thickness profile across a substrate and no deposition near an edge area of the substrate. The area near the edge where deposition is not desired is generally referred to as the "edge exclusion." FIG. 1A is a partial cross-sectional view showing the desired profile for a deposition layer 102 formed on a substrate 101. The deposition layer 102 is uniformly deposited across a top surface of the substrate 101 and there is no deposition within an edge exclusion area 103. Unfortunately, an actual deposition profile generally differs from the ideal configuration illustrated in FIG. 1A. FIG. 1B is a partial cross-sectional view showing an actual surface profile of a deposition layer 102a on the substrate 101 after having undergone a CVD or PECVD deposition. The deposition layer 102a typically extends to the edge exclusion area 103, and a bevel edge 104 with extra thickness may be formed near the edge exclusion area 103.

To prevent the formation of the deposition film at the edge of the substrate, FIG. 1C is a partial cross-sectional view showing one conventional approach that proposes to use a shadow ring 105. The shadow ring 105 is usually arranged at a location that overlaps and covers at least one portion of the edge exclusion area 103 of the substrate 101. As a result, as shown in FIG. 1C, a deposition layer 102b gradually reduces under the shadow of the shadow ring 105.

While the use of the shadow ring 105 can currently achieve thickness uniformity, or other desired edge profile, within up to a 3.5 mm-wide edge exclusion area, the requirement for thickness non-uniformity, or other desired profile characterestrics, has to be reduced to a 2 mm-wide edge exclusion area owing to increasingly shrinking device dimensions. As a result of the smaller edge exclusion area, the conventional approach using the shadow ring 105 to prevent deposition at the edge area may not provide satisfactory result.

Therefore, there is a need for an apparatus and method for depositing a film on a substrate and removing the film from the substrate edge region in an integrated manner without using a shadow ring.

SUMMARY OF THE INVENTION

The present application describes substrate processing apparatuses and methods that integrate substrate edge processing capabilities. In one embodiment, an apparatus comprises a loadlock chamber, a transfer chamber coupled to the loadlock chamber, and one or more twin process chamber coupled to the transfer chamber, each process chamber defining a plurality of separate processing regions. Each processing region comprises a substrate support having a substrate support surface, a plasma generator configured to supply an etching agent in a plasma phase to a peripheral region of the substrate support surface, and a gas delivery assembly coupled to a gas source, wherein the gas delivery assembly is configured to generate a radial gas flow over the substrate support surface, and the radial gas flow travels from an approximately central region of the substrate support surface toward the peripheral region of the substrate support surface.

In another embodiment, a substrate processing apparatus comprises a loadlock chamber, a transfer chamber coupled to the loadlock chamber, one or more twin process chamber coupled to the transfer chamber and adapted for implementing deposition processes, and a substrate edge processing chamber coupled to the transfer chamber. The substrate edge processing chamber comprises a substrate support having a substrate support surface, a plasma generator configured to supply an etching agent in a plasma phase to a peripheral region of the substrate support surface, and a gas delivery assembly coupled to a gas source, wherein the gas delivery assembly is configured to generate a radial gas flow over the substrate support surface, and the radial gas flow travels from an approximately central region of the substrate support surface toward the peripheral region of the substrate support surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7A is a schematic view of one embodiment of an edge etching apparatus.

FIG. 7B is a schematic view of one embodiment of an edge etching apparatus.

FIG. 8 is a schematic view of one embodiment of an edge etching apparatus.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to a substrate processing system that integrates substrate edge processing capabilities. More specifically, the processing system is operable to receive the load of one or more substrate, form a deposition film on each substrate, and etch a selective portion of the deposition film at an edge region of the substrate. Illustrated examples of the processing system comprises, without limitations, a factory interface, a loadlock chamber, a transfer chamber, and one or more twin process chambers having two or more processing regions that are isolatable from each other and share a common gas supply and a common exhaust pump. The processing regions in each twin process chamber include separate gas distribution assemblies and RF power sources to provide plasma at selective regions on a substrate surface in each processing region. Each twin process chamber is thereby configured to allow multiple, isolated processes to be performed concurrently on at least two substrates in the processing regions.

Figure 1A:
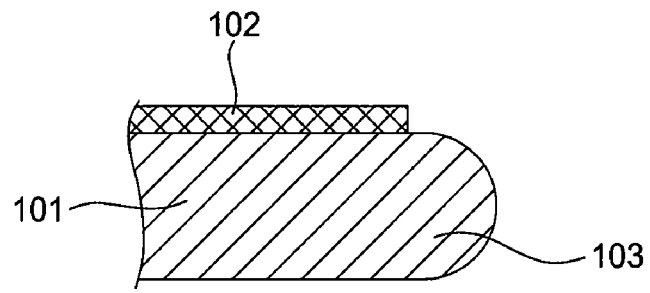
FIG. 1A illustrates a desired profile for a deposition layer at a peripheral region of a substrate.
Figure 1B:
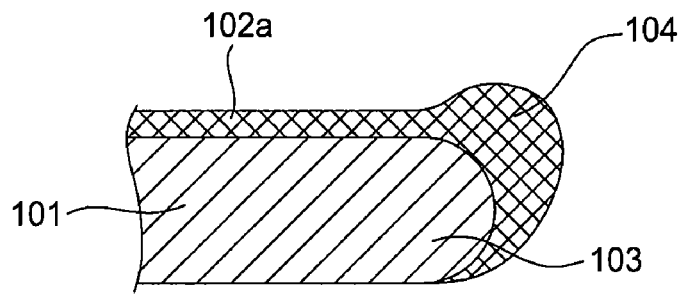
FIG. 1B illustrates a profile actually obtained for a deposition layer at a peripheral region of a substrate.
Figure 1C:
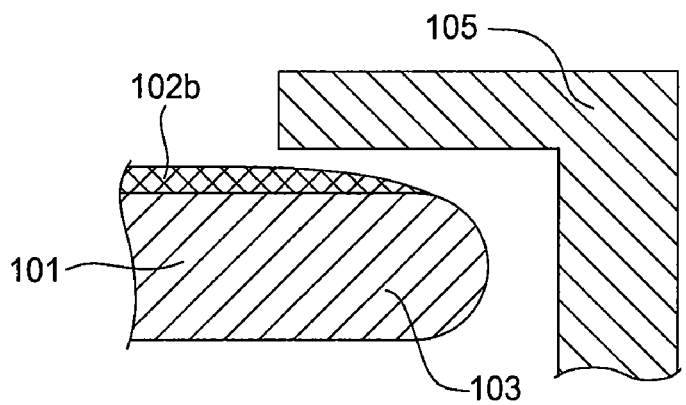
FIG. 1C illustrates one conventional approach using a shadow ring to prevent the formation of a deposition film at the peripheral region of the substrate.
Figure 2A:
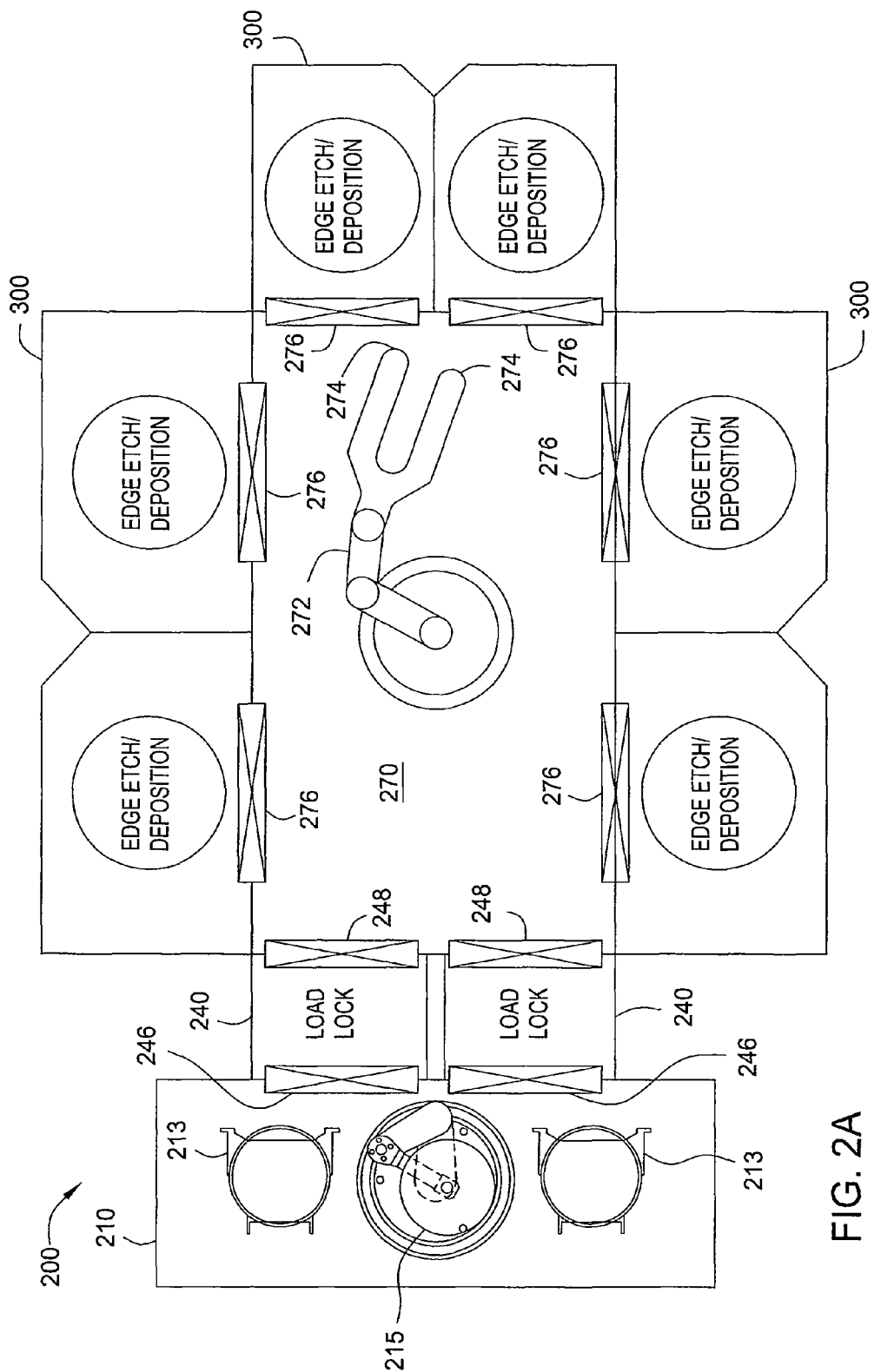
FIG. 2A is a schematic cross-sectional view showing one embodiment of a substrate processing system with substrate edge processing capabilities.

FIG. 2A is a schematic view showing an embodiment of a substrate processing system 200. The processing system 200 comprises a factory interface 210 where substrates are loaded into and unloaded from loadlock chambers 240, a substrate transfer chamber 270 housing a robot 272 for handling substrates, and a plurality of twin process chambers 300 connected to the transfer chamber 270. The processing system 200 is adapted to accommodate various processes and supporting chamber hardware such as CVD and etch processes. The embodiment described below will be directed to a system that is able to implement a PEVCD to deposit an advanced patterning film including amorphous carbon, and also etch an edge portion of the film deposited on the substrate. However, it is to be understood that other processes are contemplated by the embodiments described herein.

As shown in FIG. 2A, the factory interface 210 may include substrate cassettes 213 and a substrate-handling robot 215. Each of the cassettes 213 contains substrates ready for processing. The substrate-handling robot 215 may comprise a substrate mapping system to index the substrates in each cassette 213 in preparation for loading the substrates into the loadlock chambers 240.

Figure 2B:
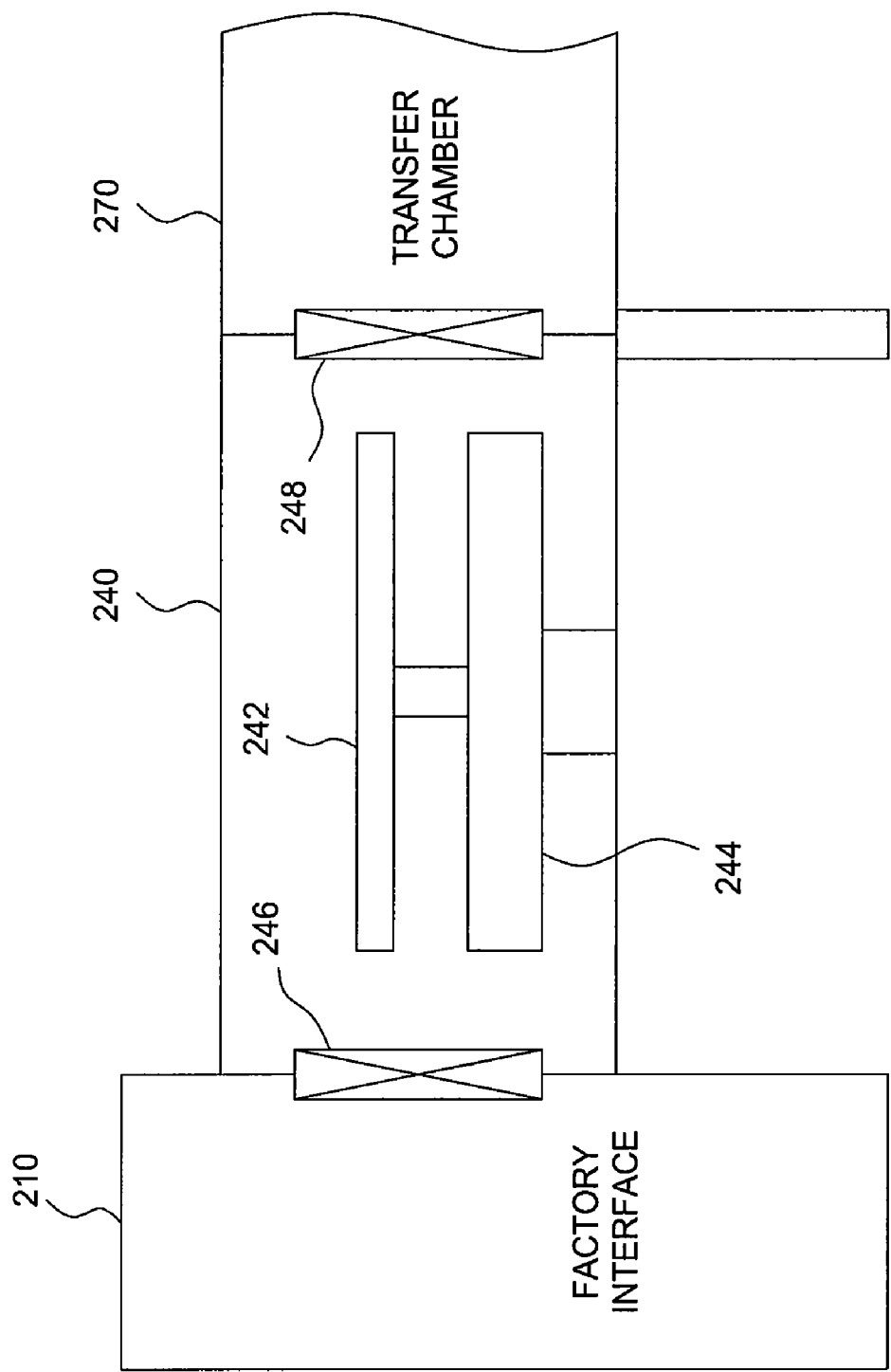
FIG. 2B is a partial cross-sectional view showing an embodiment of a loadlock chamber integrated in the processing system shown in FIG. 2A.

FIG. 2B is a schematic side view showing an embodiment of one of the loadlock chambers 240 integrated between the factory interface 210 and the transfer chamber 270. Each loadlock chamber 240 provides a vacuum interface between the factory interface 210 and the transfer chamber 270. Each loadlock chamber 240 may comprise an upper substrate support 242 and a lower substrate support 244 stacked within the loadlock chamber 240. The upper substrate support 242 and the lower substrate support 244 may be configured to support incoming and outgoing substrates thereon. Substrates may be transferred between the factory interface 210 and each loadlock chamber 240 via one slit valve 246, and between each loadlock chamber 240 and the transfer chamber 270 via one slit valve 248. The upper substrate support 242 and lower substrate support 244 may comprise features for temperature control, such as built-in heater or cooler to heat or cool substrates during transferring.

Referring to FIG. 2A again, the transfer chamber 270 includes a substrate-handling robot 272 operable to transfer substrates between the loadlock chambers 240 and the twin process chambers 300. More specifically, the substrate-handling robot 272 may have dual substrate-handling blades 274 suitable to transfer two substrates at the same time from one chamber to another. Substrates may be transferred between the transfer chamber 270 and the twin process chambers 300 via slit valves 276. The movement of the substrate-handling robot 272 may be controlled by a motor drive system (not shown), which may include a servo or stepper motor.

Figure 2C:
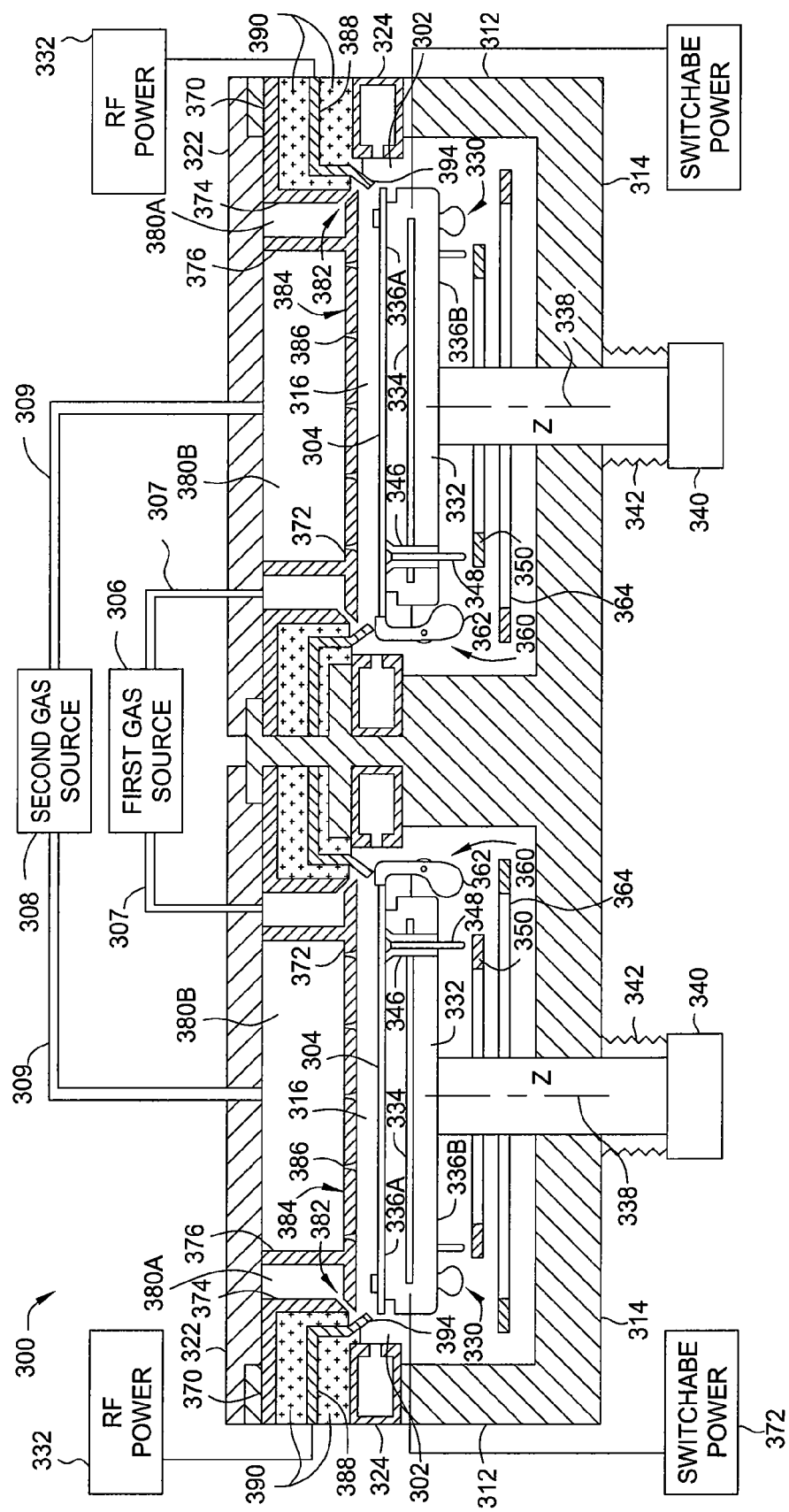
FIG. 2C is a cross-sectional view showing an embodiment of a twin process chamber.

FIG. 2C is a schematic cross-sectional view of one embodiment of the twin process chamber 300. The twin process chamber 300 is connected to the transfer chamber and includes two processing regions 302 in which individual substrates 304 can be concurrently undergo deposition and edge etching processes. Each processing region 302 has walls 312 and a bottom 314 that partially define a process volume 316 into which processes gases provided from first and second gas sources 306 and 308 may be introduced through first and second entry ports 307 and 309, respectively. The process volume 316 may be accessed through an access port (not shown) formed in the walls 312 that facilitate movement of the substrate 304 into and out of each processing region 302. The walls 312 and bottom 314 may be fabricated from a unitary block of aluminum or other material compatible with processing. The walls 312 support a lid assembly 322, and also include the assembly of a liner 324 through which the processing region 302 may be evacuated uniformly along the periphery of the processing volume 316 by a vacuum pump (not shown).

A substrate support assembly 330 may be centrally disposed within each processing region 302. In one embodiment, the support assembly 330 may be temperature controlled. The support assembly 330 may support a substrate 304 during processing. In one embodiment, the support assembly 330 comprises a support base 332 made of aluminum that may encapsulate at least one embedded heater 334 operable to controllably heat the support assembly 330 and the substrate 304 positioned thereon to a predetermined temperature. In one embodiment, the support assembly 330 may operate to maintain the substrate 304 at a temperature between about 150 degrees Celsius to about 1000 degrees Celsius, depending on the processing parameters for the material being processed.

Each support base 332 may have an upper side 336A and a lower side 336B. The upper side 336A that supports the substrate 304 has a surface area smaller than the substrate 304, so that a peripheral edge region of the substrate 304 remains free of contact with the support base 332 to facilitate its processing, such as etching, or cleaning. The lower side 336B may have a stem 338 coupled thereto. The stem 338 couples the support assembly 330 to a lift system 340 that moves the support assembly 330 vertically between an elevated processing position and a lowered position that facilitates substrate transfer to and from the processing region 302. The stem 338 additionally provides a conduit for electrical and thermocouple leads between the support assembly 330 and other components of the chamber 300. A bellows 342 may be coupled between the stem 338 and the bottom 314 of each processing region 202. The bellows 342 provides a vacuum seal between the process volume 316 and the atmosphere outside each processing region 302 while facilitating vertical movement of the support assembly 330.

To facilitate the transfer of the substrate 304, each support base 332 also has a plurality of openings 346 through which lift pins 348 are movably mounted. The lift pins 348 are operable to move between a first position and a second position. The first position, shown in FIG. 2C, allows the substrate 304 to rest on the upper side 336A of the support base 332. The second position (not shown) lifts the substrate 304 above the support base 332 so that the substrate 304 can be transferred to a substrate handling robot coming through an access port (not shown). Upward/downward movements of the lift pins 348 may be driven by a movable plate 350.

Each support assembly 330 may also comprise a centering mechanism 360 operable to center the substrate 304 relative to a vertical reference axis Z perpendicular to the substrate support plane of the support base 332. The centering mechanism 360 comprises three or more movable centering fingers 362 positioned at a periphery of the support base 332, and an opposing plate 364 placed below the fingers 362. Each finger 362 is pivotally mounted on the support base 332. The opposing plate 364 and the support base 332 are relatively movable so that the opposing plate 364 may contact and pivot the fingers 362 in a release position and stay free from the fingers 362 in a centering position.

In one embodiment, the opposing plate 364 may be stationary and the relative movement between the support base 332 and the opposing plate 364 is due to the vertical movement of the support base 332. The fingers 362 engage on the peripheral edge of the substrate 304 to center the substrate 304 when the support assembly 330 is in an elevated position as shown in FIG. 2C, and disengage from the peripheral edge of the substrate 304 when the support assembly 330 is in a lowered position (not shown). Detailed description of similar centering assembly may be found in U.S. Provisional Patent Application Ser. No. 60/982,961, entitled "APPARATUS AND METHOD FOR CENTERING A SUBSTRATE IN A PROCESS CHAMBER", filed Oct. 26, 2007, which is herein incorporated by reference.

The lid assembly 322 provides an upper boundary to the process volume 316 in each processing region 302. The lid assembly 322 may be removed or opened to service the processing regions 302. In one embodiment, the lid assembly 322 may be fabricated from aluminum.

A gas delivery assembly is coupled to an interior side of the lid assembly 322 in each processing region 302. The gas delivery assembly includes a gas bowl 370 that is connected to a switchable power source 372 operable to selectively apply various potential biases to the gas bowl 370, including an RF potential bias, DC potential bias, AC potential bias, or ground potential. The gas bowl 370 has an outer wall 374, inner wall 376 and bottom 378. The shape of the bottom 378 may be configured to substantially follow the profile of the substrate 304 processed in each processing region 302. Each gas bowl 370 includes a first gas distribution circuit coupled to the first gas source 306 via the first entry port 307, and a second gas distribution circuit coupled to the second gas source 308 via the second entry port 309.

The first gas distribution circuit includes a first plenum 380A partially delimited between the outer wall 374, inner wall 376 and bottom 378, and a plurality of slits 382 formed through a peripheral region of the bottom 378 and connected to the first plenum 380A. In one embodiment, the slits 382 may be angled outwards to avoid gas flow toward a center portion of the substrate 304.

The second gas distribution circuit includes a plenum 380B that is surrounded by the first plenum 380A. The second plenum 380B, which is connected to the second entry port 309, is partially delimited between the inner wall 376 and a perforated portion 384 of the bottom 378. The perforated portion 384 includes a plurality of apertures 386 through which gases received in the plenum 380B flow into the process volume 316.

To etch a portion of a deposition film at an edge region of one substrate 304, each processing region 302 also includes a plasma generator that is disposed adjacent to the outer wall 374 for striking a plasma in a peripheral region of the substrate 304. The plasma generator includes an electrode 388 sandwiched between isolator materials 390, which are arranged adjacent to the outer wall 374 of the gas bowl 370. The electrode 388 is coupled to a RF power source 392, and includes a slant end 394 positioned proximate to the outer wall 374 and a peripheral portion of the support base 332.

Each of the processing region 302 configured as described above may be able to selectively operate in either a deposition mode or edge etching mode.

In a deposition mode of operation (such as PECVD), the plenum 380B receives a process gas from the second gas source 308, and the substrate 304 is heated. While the support assembly 330 is grounded, the switchable power source 372 applies an RF potential bias to the gas bowl 370, such that a plasma is generated from the process gas introduced through the apertures 386 into the process volume 316 between the support assembly 330 and the gas bowl 370. The entire substrate 304 is thereby exposed to the plasma for processing, for example for depositing a film on the substrate 304. The RF power from the switchable power source 372, the composition of the process gas, and the thermal conditions applied to the substrate 304 may be set in accordance with the type of deposition film to form on the substrate 304.

In one embodiment, the deposition film may include an advanced patterning film ("APF") including amorphous carbon. The APF may be deposited at a substrate temperature between about 200° C. and 1500° C., while a process gas including propylene ($C_3H_6$) as carbon source is introduced in the process volume 316. Optionally, the process gas may include additional chemical elements to include in the APF, such as a nitrogen ($N_2$) and doping elements. RF power from about 500 W to about 1500 W may be applied in the chamber at a frequency of about 13.56 MHz. A more detailed description of conditions for forming the APF by PECVD and its use is described in U.S. Pat. No. 7,262,106, entitled "Absorber Layer for DSA Processing", which is incorporated herein by reference.

Once the formation of the deposition film is completed, the edge etching function may be used to remove undesirable portions of the deposition film in the edge region of the substrate 304. In an edge etching mode of operation, the first plenum 380A receives an etching gas from the first gas source 306 via the first entry port 307. Examples of etching gases may include, without limitation, $NF_3$, $O_2$, $F_2$, or $SF_6$. In the meantime, the gas bowl 370 and support base 332 may be grounded, such that RF power applied to the electrode 388 excites the etching gas introduced via the slits 382 in the vicinity between the slant end 394, the support base 332 and the gas bowl 370. The inclination angle of the slant end 394 may be set so as to facilitate the ionization of the etching gas delivered from the slits 382. An etching agent in a plasma phase is thereby formed in the vicinity of the edge region of the substrate 304.

To prevent the diffusion of the etching agent toward the central region of the substrate 304, the second gas source 308 provides an inert gas that is delivered via the second gas distribution circuit, and flows radially on the top surface of the substrate 304 from its central region toward its peripheral edge region. The radial flow of the inert gas allows to limit the action area of the etching agent to the peripheral region of the substrate 304.

While one specific implementation of the process system 300 has been illustrated above, variant embodiments may be possible. For example, alternate embodiments may define a plasma volume inside each processing region 302, but away from the substrate edge, such as integrated in the gas bowl 370. The plasma volume receives a flow of processing gas, which is excited as it passes between ground and RF electrodes placed in the plasma volume before it is delivered to the edge region of the substrate 304. In other embodiments, the plasma may be provided by a remote plasma source located outside each of the processing regions 302. Examples of similar processing systems for processing substrate edges are described U.S. Provisional Patent Application Ser. No. 60/982,993, entitled "APPARATUS AND METHOD FOR PROCESSING A SUBSTRATE EDGE REGION", filed Oct. 26, 2007, which is herein incorporated by reference.

As has been described above, the processing system 200 is thus able to integrate substrate edge processing capabilities to process multiple substrates concurrently. While each twin process chamber of the processing system shown in FIG. 2A have been described as including both deposition and edge etching capabilities, other processing systems may integrate diverse combinations of processing chambers in which the edge processing function may be implemented in a standalone chamber. Examples of substrate processing systems with standalone process chambers implementing the edge processing function are described hereafter in conjunction with FIGS. 3A, 3B, and 4.

Figure 3A:
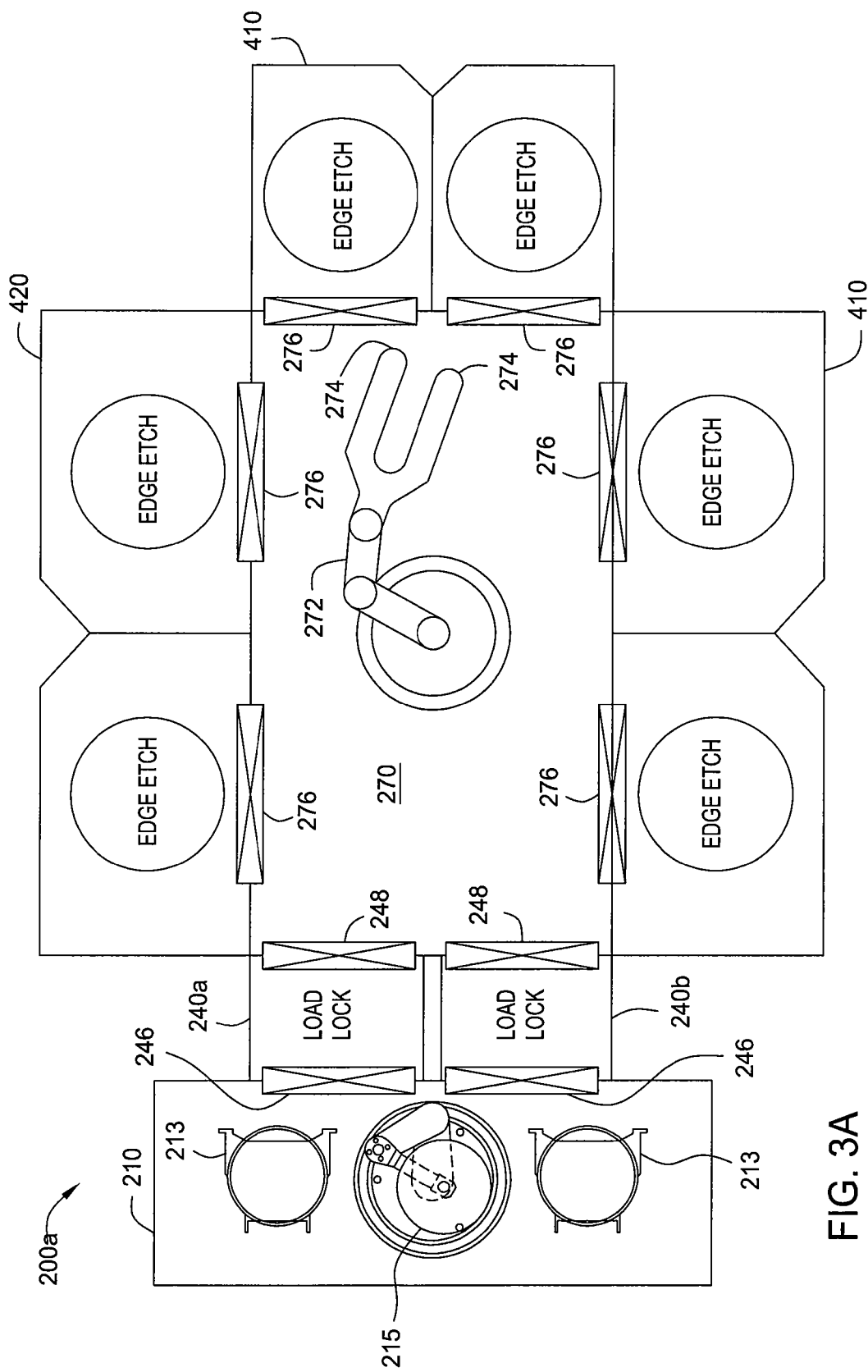
FIG. 3A is a schematic cross-sectional view showing one embodiment of a substrate processing system with substrate edge processing capabilities.

FIG. 3A is a schematic view showing another embodiment of a substrate processing system 200a. Like the embodiment shown in FIG. 2A, the processing system 200a comprises a factory interface 210 where substrates are loaded into and unloaded from loadlock chambers 240a, 240b, and a substrate transfer chamber 270 housing a robot 272 for handling substrates. However, instead of twin process chambers that integrate both deposition and edge etching processes, the system 200a comprises twin process chambers that implement edge etching processes only. More specifically, twin process chambers 420 are configured to implement edge etching processes.

Figure 3B:
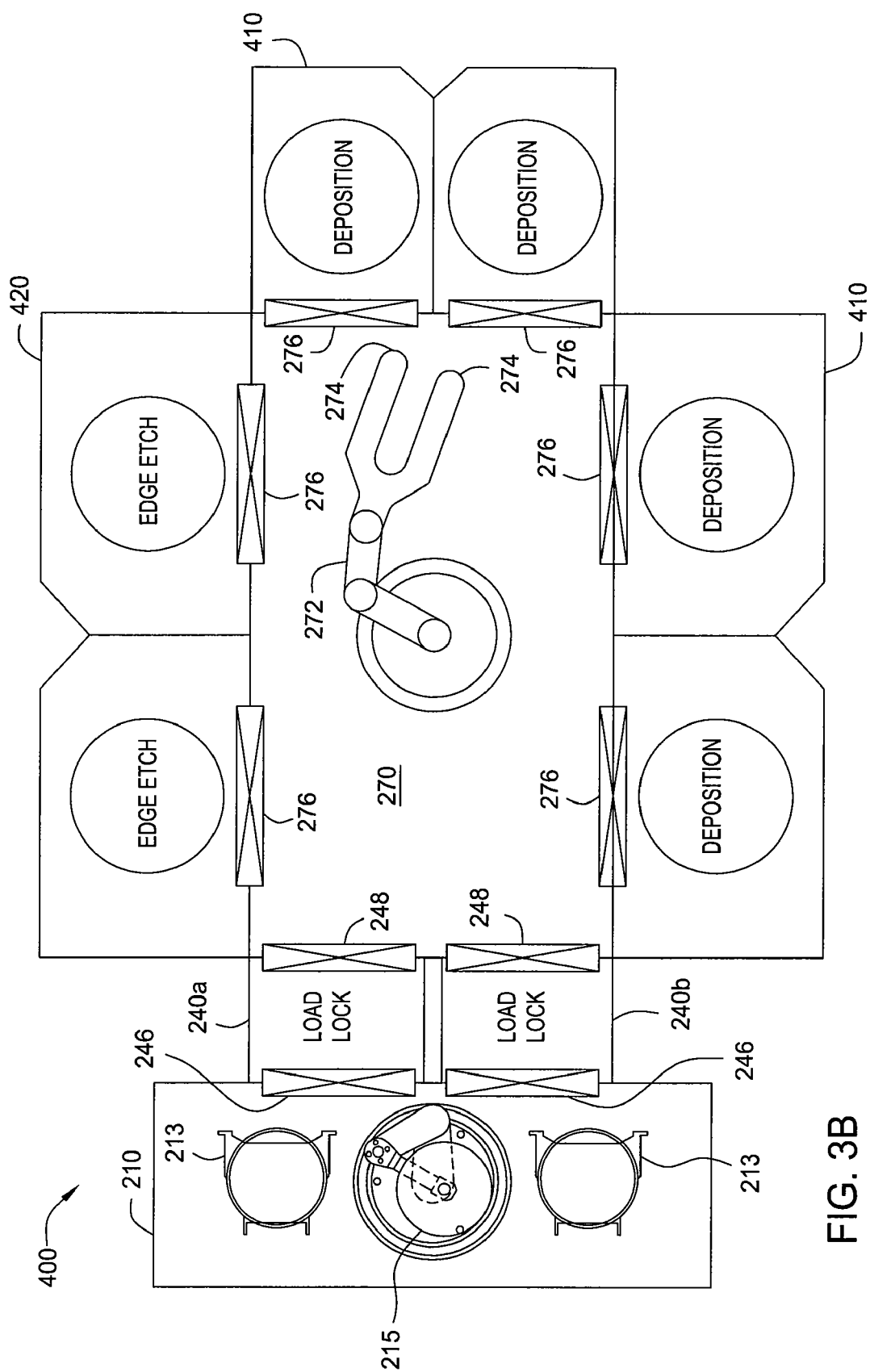
FIG. 3B is a schematic view showing another embodiment of a substrate processing system integrating an edge etching function.

The twin process chamber 420 receives substrates that have been processed in the twin process chamber 410. The processed substrates have edge regions where portions of deposition films are to be etched away in the twin process chamber 420. A suitable structure for the twin process chamber 420 may be similar to the twin process chamber 300 illustrated in FIG. 2C. Examples of alternate embodiments of the twin process chambers 420 adapted for processing substrate edge regions are also described in U.S. Provisional Patent Application Ser. No. 60/982,993, entitled "APPARATUS AND METHOD FOR PROCESSING A SUBSTRATE EDGE REGION", filed Oct. 26, 2007, which is herein incorporated by reference. For example, as shown in FIGS. 3A-3C of this application, the plasma generator used to create a plasma etching agent at the edge region of the substrate may be incorporated in the gas distribution assembly of the process chamber. The plasma etching agent formed inside the gas distribution assembly then may be delivered to the edge region of the substrate through a gas distribution plate. In alternate embodiments illustrated in FIGS. 2A and 2B of the same application, the plasma etching agent may provided from a remote plasma source, and delivered through the gas distribution assembly to the edge region of the substrate.

In one embodiment, the processing system 200a may be operable to process a plurality of substrates by loading the substrates from the factory interface 210 into the loadlock chamber 240a. The substrate-handling robot 272 may then transfer the substrates from the loadlock chamber. 240a into the twin process chamber 420 to undergo edge etching. After all the requisite semiconductor processes have been completed, the substrate-handling robot 272 may finally transfer the processed substrates out of the vacuum environment via the loadlock chamber 240b to the factory interface 210.

FIG. 3B is a schematic view showing another embodiment of a substrate processing system 400. Like the embodiment shown in FIG. 2A, the processing system 400 comprises a factory interface 210 where substrates are loaded into and unloaded from loadlock chambers 240a, 240b, and a substrate transfer chamber 270 housing a robot 272 for handling substrates. However, instead of twin process chambers that integrate both deposition and edge etching processes, the system 400 comprises twin process chambers that implement deposition and edge etching processes separately. More specifically, twin process chambers 410 are configured to implement deposition processes, and twin process chambers 420 are configured to implement edge etching processes.

Each twin process chamber 410 is configured to implement CVD processes to form diverse deposition films on substrates. Each twin process chamber 410 may have two or more processing regions that are isolatable from each other and share a common gas supply and a common exhaust pump. The processing regions in each twin process chamber 410 include separate gas distribution assemblies and RF power sources to provide uniform plasma density over a substrate surface in each processing region. Each twin process chamber 410 is thereby configured to allow multiple, isolated processes to be performed concurrently on at least two substrates in the processing regions. Examples of twin process chambers adapted for deposition processes are disclosed in U.S. Pat. No. 5,855,681, entitled "ULTRA HIGH THROUGHPUT WAFER VACUUM PROCESSING SYSTEM", which is incorporated herein by reference.

In one embodiment, the processing system 400 may be operable to process a plurality of substrates by loading the substrates from the factory interface 210 into the loadlock chamber 240a. The substrate-handling robot 272 may then transfer the substrates from the loadlock chamber 240a into one twin process chamber 410 to undergo one or more deposition processes. To remove undesirable portions of a deposition film formed at the edge region of the substrates, the substrate-handling robot 272 may transfer the processed substrates from one of the twin process chambers 410 to the twin process chamber 420 to undergo edge etching. After all the requisite semiconductor processes have been completed, the substrate-handling robot 272 may finally transfer the processed substrates out of the vacuum environment via the loadlock chamber 240b to the factory interface 210.

Figure 4:
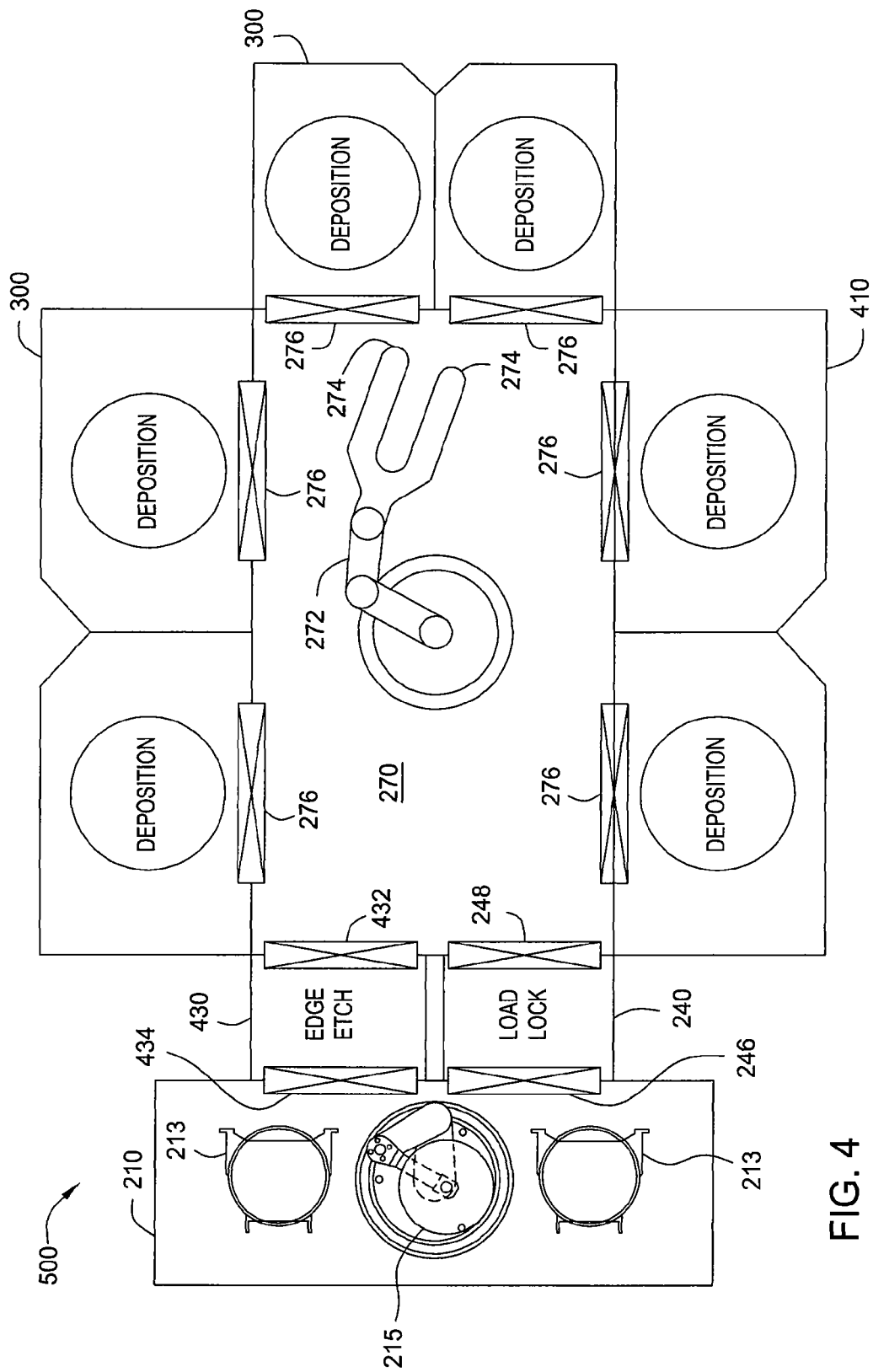
FIG. 4 is a schematic view showing yet another embodiment of a substrate processing system integrating an edge etching function.

FIG. 4 is a schematic view showing another embodiment of a substrate processing system 500. The processing system 500 differs from the embodiment shown in FIG. 3 in that it integrates more twin process chambers 410 implementing deposition processes, e.g. three twin process chambers 410 instead of two in the embodiment of FIG. 3B. The substrate edge processing function is implemented in a standalone edge etching chamber 430 disposed between the transfer chamber 270 and the factory interface 210. Substrates may be transferred from the transfer chamber 270 into the edge etching chamber 430 via a slit valve 432.

Figure 6A:
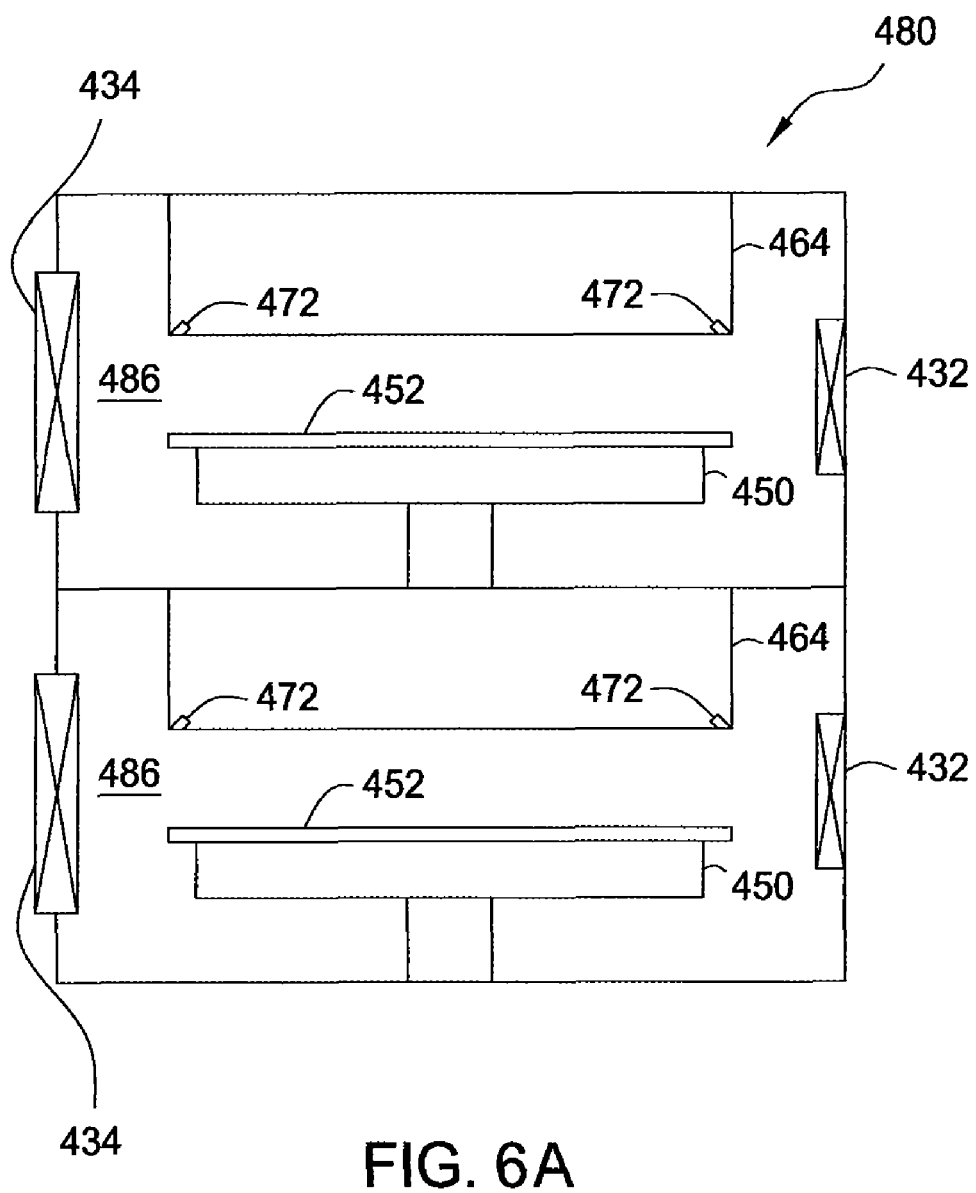
FIG. 6A is a schematic cross-sectional view showing an alternate embodiment of an edge etching chamber that has two processing regions stacked above each other to process at least two substrates in parallel.
Figure 6B:
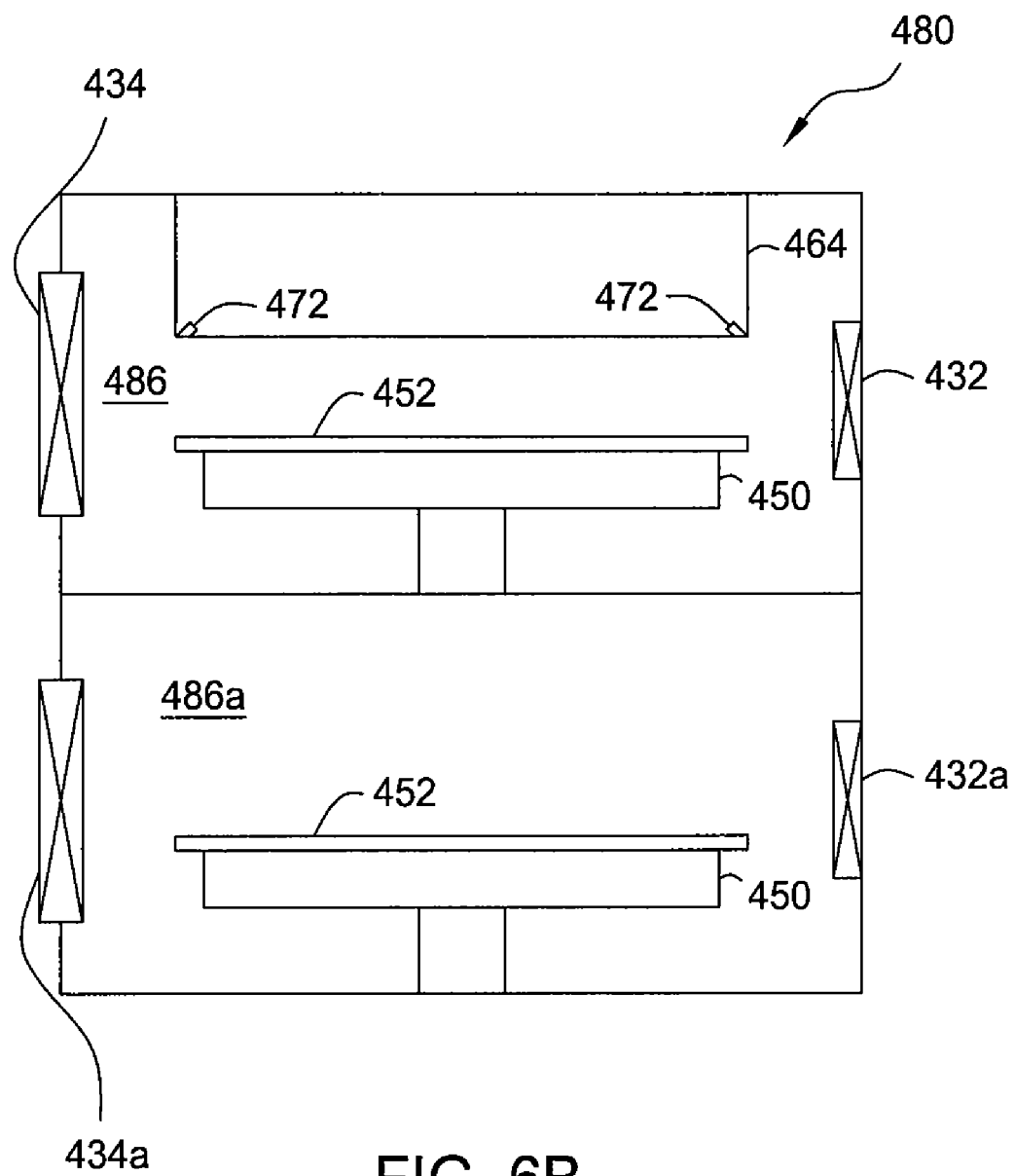
FIG. 6B is a schematic cross-sectional view showing an alternate embodiment of an edge etching chamber which is stacked together with a loadlock chamber.

In one embodiment, the edge etching chamber 430 and the loadlock chamber 240 may be vertically stacked together similar to an edge etch—load lock combo shown in FIG. 6B.

Figure 5:
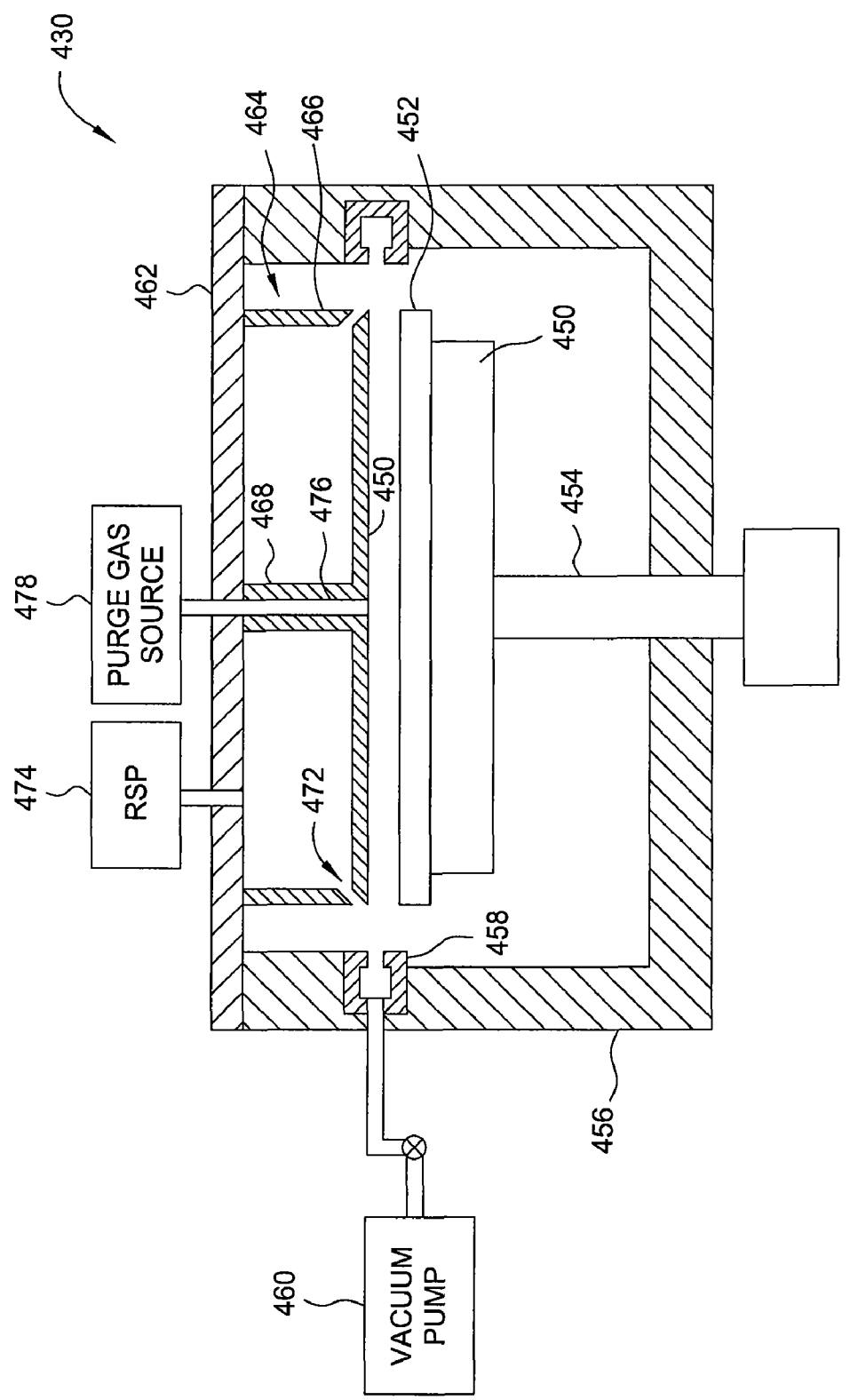
FIG. 5 is a schematic cross-sectional view showing one embodiment of an edge etching chamber.

FIG. 5 is a schematic cross-sectional view illustrating one embodiment of the edge etching chamber 430. The edge etching chamber 430 may comprise a substrate support 450 adapted to carry a substrate 452. The substrate support 450 is coupled to a stem 454 vertically movable to load and unload the substrate 452. A sidewall 456 of the edge etching chamber 430 may be provided with a liner 458 that is coupled to a vacuum pump 460 to evacuate the interior volume of the chamber 430. A lid assembly 462 upwardly confines the interior volume of the chamber 430. An inner side of the lid assembly 462 is coupled to a gas distribution bowl 464 that has an outer wall 466, inner wall 468, and bottom 470. A peripheral area of the bottom 470 comprises a plurality of slits 472 that deliver an etching agent in a plasma phase from a remote plasma source ("RPS") 474 to the edge region of the substrate 452. A gas conduit 476 is delimited by the inner wall 468, and opens at central area of the bottom 470. The gas conduit 476 is coupled to a purge gas source 478 for delivering an inert gas toward a central area of the substrate 452. The gas flow provided along the gas conduit 476 is configured from the center to the edge to protect unprocessed regions of the substrate 452. A more detail description of the foregoing and other embodiments of the edge etching chamber 430 can be found in U.S. Provisional Patent Application Ser. No. 60/982,993, entitled "APPARATUS AND METHOD FOR PROCESSING A SUBSTRATE EDGE REGION", filed Oct. 26, 2007, which is herein incorporated by reference.

Referring again to FIG. 4, in operation, the processing system 500 may load a plurality of substrates to process from the factory interface 210 into the loadlock chamber 240. The substrate-handling robot 272 may then transfer the substrates from the loadlock chamber 240 into one of the twin process chambers 410 to undergo one or more deposition processes. To remove undesirable portions of a deposition film formed at the edge region of the substrates, the substrate-handling robot 272 may transfer the processed substrates from one twin process chamber 410 into the edge etching chamber 430 to undergo edge etching. After the edge processing operation is completed, the processed substrate may either be transferred back to one of the twin process chambers 410 to undergo further deposition, or transferred out via the loadlock chamber 240 to the factory interface 210.

It is worth noting that the edge etching chamber may be configured to process two or more substrates in parallel. FIG. 6A is a schematic cross-sectional view that shows an alternate embodiment of an edge etching chamber 480 that has two processing regions 486 stacked above each other to process at least two substrates 452 in parallel. Each of the processing regions 486 may be configured similar to the interior of the edge etching chamber 430 shown in FIG. 5, and has one substrate support 450 and one gas bowl 464. Each gas bowl 464 has slits 472 adapted to deliver a plasma etching agent to the edge region of a substrate to remove portions of a deposition film thereon.

FIG. 6B is a schematic cross-sectional view that shows an edge etching-loadlock combo 480a that has one processing region 486 stacked above an loadlock region 486a. The processing region 486 is configured similar to the interior of the edge etching chamber 430 shown in FIG. 5, and has one substrate support 450 and one gas bowl 464. Each gas bowl 464 has slits 472 adapted to deliver a plasma etching agent to the edge region of a substrate to remove portions of a deposition film thereon. The edge etching-loadlock combo 480a may be positioned between a factory interface and a transfer chamber.

In alternate embodiments, the substrate edge etching function may also be more simply provided in the form of an edge etching apparatus comprised of a factory interface and a standalone edge etching chamber, as illustrated in FIGS. 7A, 7B, and 8.

In FIG. 7A, an edge etching apparatus 602 comprises a factory interface 604 and a standalone edge etching chamber 606. A substrate to be processed is loaded from the factory interface 604 into the edge etching chamber 606 to undergo edge etching. Once it has been processed, the substrate then may be unloaded from the edge etching chamber 606 back to the factory interface 604.

In FIG. 7B, an edge etching apparatus 608 comprises a factory interface 604 connected to a standalone edge etching chamber 606 via a loadlock chamber 610.

FIG. 8 illustrates another embodiment of an edge etching apparatus 612 in which a twin edge etching chamber 614 is coupled to the factory interface 604. The twin edge etching chamber 614 has two processing regions configured to process at least two substrates in parallel. Each substrate processed in each of the processing regions may be separately loaded from and unloaded to the factory interface 604.

As has been described above, the processing systems and methods described herein are thus able to integrate substrate edge processing capabilities to process multiple substrates concurrently. High throughput processing combined with substrate edge processing capabilities thus can be advantageously achieved.

While the foregoing is directed to certain embodiments of the present invention, other and further embodiments of the invention may be devised without departing from the basic scope thereof, and the scope thereof is determined by the claims that follow.

What is claimed is:

1. An apparatus for processing multiple substrates, comprising:
    a loadlock chamber;
    a transfer chamber coupled to the loadlock chamber; and
    one or more twin process chambers coupled to the transfer chamber, wherein each twin process chamber defines a plurality of separate processing regions, and each processing region comprises:
        a substrate support having a substrate support surface;
        a gas delivery assembly comprising a gas bowl, wherein the gas bowl comprises:
            an outer wall;
            an inner wall; and
            a bottom facing the substrate support surface, wherein the outer wall, the inner wall and the bottom form a first plenum connected to a first entry port, a plurality of slits are formed through a peripheral region of the bottom connecting the first plenum to the processing region, the inner wall and a perforated portion of the bottom form a second plenum surrounded by the first plenum and connected to a second entry port, and a plurality of apertures formed through the perforated portion of the bottom connect the second plenum to the processing region; and a plasma generator comprising an electrode coupled to a radio frequency power source, wherein the electrode is sandwiched in insulator materials and has an end positioned proximate to a periphery region of the substrate support surface, and the electrode is configured to strike a plasma in a processing gas from the first plenum near the peripheral region of the substrate support surface.

2. The apparatus of claim 1, wherein a distance between the electrode and the gas delivery assembly or the substrate support surface varies at different locations.

3. The apparatus of claim 2, wherein the electrode includes a slant end positioned proximate to the outer wall of the gas delivery assembly and the peripheral region of the substrate support surface.

4. The apparatus of claim 3, wherein the electrode comprises a portion disposed inside the first plenum of the gas delivery assembly.

5. The apparatus of claim 3, wherein the substrate support is coupled to one of a ground potential, a DC potential and an AC potential.

6. The apparatus of claim 3, wherein the slant end portion of the electrode of the plasma generator is arranged outside the gas delivery assembly.

7. The apparatus of claim 1, wherein the first entry port of the gas delivery assembly is coupled to an etching gas source for delivering an etching gas to the plasma generator.

8. The apparatus of claim 7, wherein the second plenum of the gas delivery assembly is coupled to a gas source configured to supply a process gas for forming a deposition film on a substrate disposed in each processing region.

9. The apparatus of claim 1, wherein the gas delivery assembly is coupled to one of a ground potential, a DC potential or an AC potential.

10. The apparatus of claim 1, wherein the bottom of the gas delivery assembly is a gas distribution plate configured to evenly distribute a processing gas across the substrate support.

11. The apparatus of claim 1, wherein the plurality of slits are angled outwards to avoid gas flow towards a center region of the substrate support surface.

* * * * *